United States Patent [19]

Getman et al.

[11] Patent Number: 5,757,104
[45] Date of Patent: May 26, 1998

[54] METHOD OF OPERATING AN ULTRASONIC PIEZOELECTRIC TRANSDUCER AND CIRCUIT ARRANGEMENT FOR PERFORMING THE METHOD

[75] Inventors: Igor Getman; Sergey Lopatin, both of Lörrach, Germany

[73] Assignee: Endress + Hauser GmbH + Co., Maulburg, Germany

[21] Appl. No.: 906,130

[22] Filed: Aug. 5, 1997

Related U.S. Application Data

[63] Continuation of Ser. No. 534,504, Sep. 27, 1995, abandoned.

[30] Foreign Application Priority Data

Oct. 10, 1994 [EP] European Pat. Off. ............. 94115958

[51] Int. Cl.[6] .................................................. H01L 41/08
[52] U.S. Cl. ..................... 310/317; 310/319; 310/334; 310/366
[58] Field of Search ........................... 310/316, 317, 310/319, 365, 366, 334–337

[56] References Cited

U.S. PATENT DOCUMENTS

| 3,573,672 | 4/1971 | Fair et al. ........................ 310/312 X |
|---|---|---|
| 3,676,720 | 7/1972 | Libby et al. ........................ 310/316 |
| 4,096,756 | 6/1978 | Alphonse ........................ 310/334 X |
| 4,181,864 | 1/1980 | Etzold ........................ 310/366 X |
| 4,287,493 | 9/1981 | Masaie ........................ 333/191 |
| 4,343,827 | 8/1982 | Thompson ........................ 427/8 |
| 4,353,004 | 10/1982 | Kleinschmidt ........................ 310/318 |
| 4,354,132 | 10/1982 | Borburgh et al. ........................ 310/334 |
| 4,356,422 | 10/1982 | van Maanen ........................ 310/334 X |
| 4,427,912 | 1/1984 | Bui et al. ........................ 310/334 X |
| 4,523,471 | 6/1985 | Lee ........................ 310/334 X |
| 4,811,307 | 3/1989 | Pohlenz et al. ........................ 367/135 |
| 5,381,067 | 1/1995 | Greenstein et al. ........................ 310/334 |
| 5,410,205 | 4/1995 | Gururaja ........................ 310/328 |

FOREIGN PATENT DOCUMENTS

| 992 526 | 10/1951 | France . |
|---|---|---|
| 2 021 887 | 7/1970 | France . |
| 2 581 821 | 11/1986 | France . |
| 1 105 114 | 3/1968 | United Kingdom . |

*Primary Examiner*—Mark O. Budd
*Attorney, Agent, or Firm*—Bose McKinney & Evans

[57] ABSTRACT

An ultrasonic piezoelectric transducer is alternatingly operated in a transmitting mode and in a receiving mode. In the transmitting mode an electrical excitation signal is applied between one or more common electrodes and one or more transmission electrodes, and in the receiving mode an electrical reception signal is collected between the one or more common electrodes and one or more reception electrodes. Moreover, in the receiving mode one or more electrodes which are not used as reception electrodes are connected via a low impedance connection with the one or more common electrodes which has the effect that in the receiving mode the resonance frequencies of the piezoelectric transducer are shifted to lower values so that with the same operating frequency the piezolectric transducer is in series resonance in the transmitting mode and in parallel resonance in the receiving mode. In this way, the piezoelectric transducer operates under optimum conditions with perfect frequency matching both for transmission and for reception.

16 Claims, 4 Drawing Sheets

METHOD OF OPERATING AN ULTRANSONIC PIEZOELECTRIC TRANSDUCER AND CIRCUIT ARRANGEMENT FOR PERFORMING THE METHOD

This is a Continuation of application Ser. No. 08/534,504, filed Sep. 27, 1995, now abandoned.

FIELD OF THE INVENTION

The invention generally relates to ultrasonic piezoelectric transducers and, more particularly, to a method of operating an ultrasonic piezoelectric transducer alternatingly in a transmitting mode and in a receiving mode and to a circuit arrangement for performing the method.

BACKGROUND OF THE INVENTION

There are many fields of application where ultrasonic piezoelectric transducers are used for transmission and reception of ultrasonic waves, for instance:

- ultrasonic air sensors for distance measurement and presence sensing;
- hydroacoustic transducers for echo sounders and sonar;
- medical ultrasonic devices;
- non-destructive testing of materials;
- ultrasonic delay lines;
- piezoelectric bulk filters.

DESCRIPTION OF THE PRIOR ART

The normal piezoelectric elements which are used in ultrasonic sensors possess a series resonance frequency and a parallel resonance frequency. It is well known that these elements show the maximum displacement and thus the optimum transmission performance at the series resonance frequency, but the maximum receiving sensitivity at the parallel resonance frequency which is up to 16% higher than the series resonance frequency. Thus, if an ultrasonic piezoelectric transducer is operated at its series resonance frequency so that it emits ultrasonic waves with maximum efficiency, it can receive the echo signals, which have the same frequency, only with a poor sensitivity. This is the reason why in many cases two piezoelectric sensors are used, one for transmission which is so designed that its series resonance frequency coincides with the operating frequency, and the other one for reception which is so designed that its parallel resonance frequency coincides with the operating frequency. When a single piezoelectric transducer has to be used alternatingly for transmission and reception at the same operating frequency, a matching of the series and parallel resonance frequencies is required. The traditional way to solve this problem is based on a matching of the piezoelectric element with so-called $\lambda/4$ low impedance layers (Sylgrad, Eccolite, foamed materials). Additional frequency matching may be obtained by means of inductivity matching in electronic circuits. As a result of these measures the band width of the piezoelectric transducer is broadend so that the echo signals can be received by the same piezoelectric element with adequate sensitivity.

OBJECTIVE AND SUMMARY OF THE INVENTION

It is a principal objective of the invention to provide a method of operating an ultrasonic transducer alternatingly in a transmitting mode and in a receiving mode with a perfect frequency matching so that the ultrasonic transducer has optimum characteristics both for transmission and for reception at the same operating frequency.

This objective is achieved by providing a method of operating an ultrasonic piezoelectric transducer alternatingly in a transmitting mode and in a receiving mode, the transducer comprising a body of piezoelectric material provided with at least three electrodes, wherein in the transmitting mode an electrical excitation signal is applied between one or more common electrodes and one or more transmission electrodes adapted to excite the body of piezoelectric material to mechanical vibrations in a radial, thickness or overtones vibration mode, and wherein in the receiving mode an electrical reception signal is collected between the one or more common electrodes and one or more reception electrodes adapted to convert mechanical vibrations of the body of piezoelectric material into an electrical signal, and wherein in the receiving mode one or more electrodes which are not used as reception electrodes are connected via a low impedance connection with the one or more common electrodes.

The method according to the invention has the effect that in the receiving mode the resonance frequencies of the piezoelectric transducer are shifted to lower values so that the parallel resonance frequency assumes the frequency value which the series resonance frequency has in the transmitting mode. Thus, with the same operating frequency the piezoelectric transducer is in series resonance in the transmitting mode and in parallel resonance in the receiving mode. In this way, the piezoelectric transducer operates under optimum conditions with perfect frequency matching both for transmission and for reception.

A preferred circuit arrangement for performing the method as defined above comprises an ultrasonic piezoelectric transducer having a body of piezoelectric material provided with at least three electrodes, an excitation signal source adapted to be connected to one or more common electrodes and one or more electrodes which are used as transmission electrodes in a transmitting mode, a reception circuit adapted to be connected to the one or more common electrodes and one or more electrodes which are used as reception electrodes in a receiving mode, and means for establishing a low impedance connection in the receiving mode between the one or more common electrodes and one or more electrodes which are not used as reception electrodes.

Further details and advantages of the invention will be understood from the following detailed description of embodiments thereof in conjunction with the accompanying drawings.

BRIEF DESCRIPTION OF PREFERRED EMBODIMENTS

Figure 1:
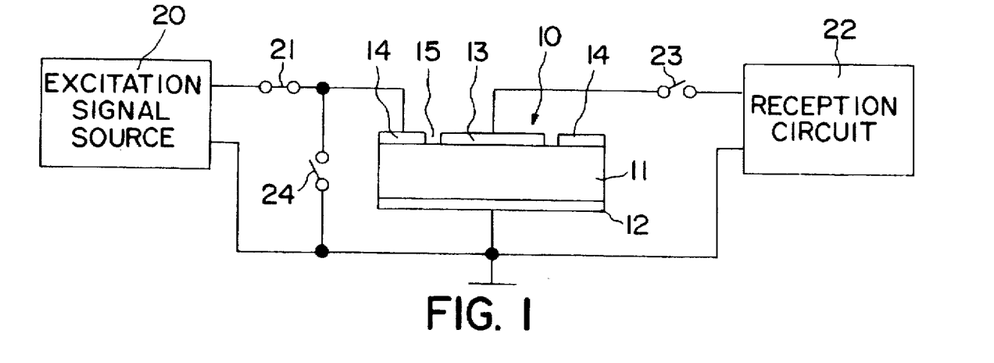
FIG. 1 is a diagram of a first embodiment of the circuit arrangement for performing the method according to the invention.
Figure 2:
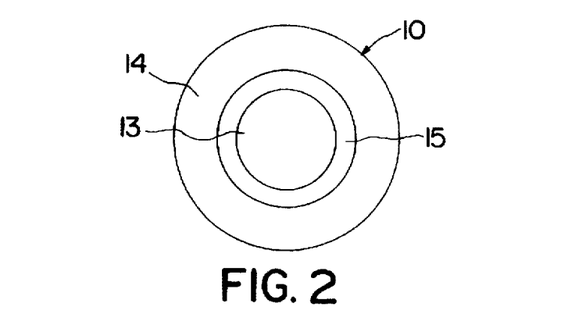
FIG. 2 is a top view of the piezoelectric transducer used in the circuit arrangement of FIG. 1.

The circuit arrangement shown in FIG. 1 comprises an ultrasonic piezoelectric transducer 10 having a body 11 of piezoelectric material, which in the illustrated embodiment is in the form of a circular disk, and electrodes 12, 13 and 14 formed by metallizations or metal layers applied to opposite sides of the body 11. In the illustrated embodiment, the electrode 12 is a common electrode applied to a first side of the body 11 which in FIG. 1 is the bottom side of the disk, and the two electrodes 13 and 14 are applied to an opposite second side of the body 11 which in FIG. 1 is the top side of the disk. As visible in the top view of FIG. 2, the electrode 13 is a circular central electrode, and the electrode 14 is an annular electrode surrounding the central electrode 13, the two electrodes being separated and electrically isolated from each other by an annular gap 15.

In FIG. 1, the common electrode 12 is connected to a common potential, for instance the ground potential, the annular electrode 14 is connected with the output of an excitation signal source 20 via a switch 21, and the central electrode 13 is adapted to be connected with the input of a reception circuit 22 via a switch 23. This arrangement permits to operate the piezoelectric transducer 10 alternatingly in a transmitting mode and in a receiving mode. In the transmitting mode, the switch 21 is closed and the switch 23 is open which is the position shown in FIG. 1. The excitation signal source 20 emits an alternating electrical excitation signal which is applied to the piezoelectric transducer 10 between the common electrode 12 and the annular electrode 14. This alternating electrical excitation signal causes the piezoelectric transducer 10 to vibrate in a radial, thickness or overtones vibration mode and to emit an ultrasonic wave having the frequency of the alternating electrical excitation signal. In the receiving mode, the position of the switches 21 and 23 are reversed so that the switch 21 is open and the switch 23 is closed. No electrical excitation signal is applied to the piezoelectric transducer 10; when the piezoelectric transducer 10 is set into vibrations by arriving ultrasonic waves, it generates an alternating electrical reception signal having the frequency of the ultrasonic wave between the common electrode 12 and the central electrode 13. This reception signal is applied to the input of the reception circuit 22.

An example of a field of use of circuit arrangements of the type shown in FIG. 1 is the measuring of distances using the pulse transit time principle. In this application, the excitation signal source 20 supplies short transmission pulses in regularly spaced transmission periods to the piezoelectric transducer 10 which for each transmission pulse emits a pulse-shaped ultrasonic wave which is propagated through the medium surrounding the piezoelectric transducer 10. The interval between two consecutive transmission pulses is a reception period in which the piezoelectric transducer 10 receives ultrasonic echo pulses generated by reflection of the ultrasonic waves at targets situated in the path of propagation. These ultrasonic echo pulses are converted by the piezoelectric transducer 10 into electrical reception signals that are supplied to the reception circuit 22. The time which elapsed between the transmission of a transmission pulse and the receipt of an echo pulse corresponds to the transit time of the ultrasonic wave from the piezoelectric transducer 10 to the target and back to the piezoelectric transducer 10, and from this transit time and the known sonic speed in the propagation medium the distance between the piezoelectric transducer 10 and the target can be calculated.

For distance measurement, the propagation medium usually is air or water, as for instance in echo sounding or sonar applications. Other fields of use in which the same ultrasonic piezoelectric transducer is alternatingly operated in a transmitting mode and in a receiving mode with other propagation media are medical ultrasonic devices, non-destructive testing of materials, ultrasonic delay lines and piezoelectric bulk filters.

Figures 3A, 3B:
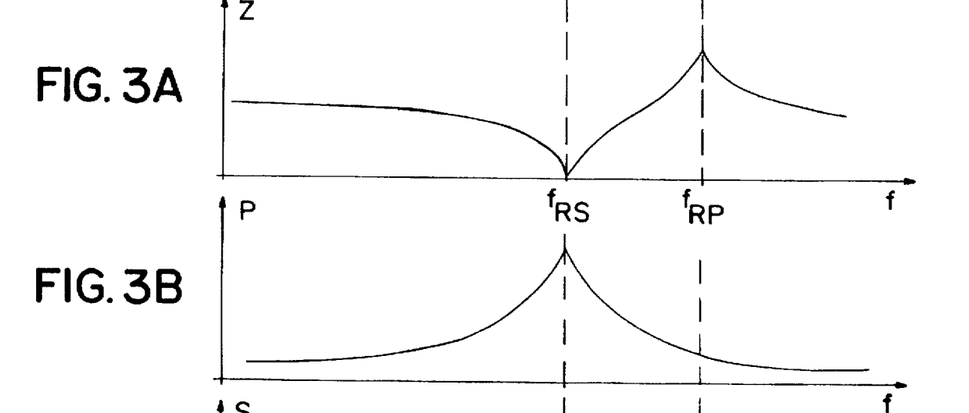
FIG. 3 shows diagrams of characteristic curves of the piezoelectric transducer.
Figure 3C:
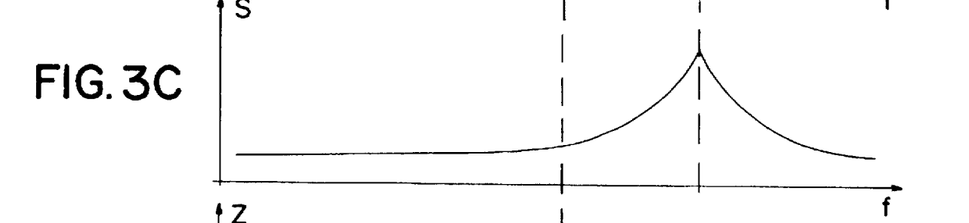
Figures 3D, 3E:
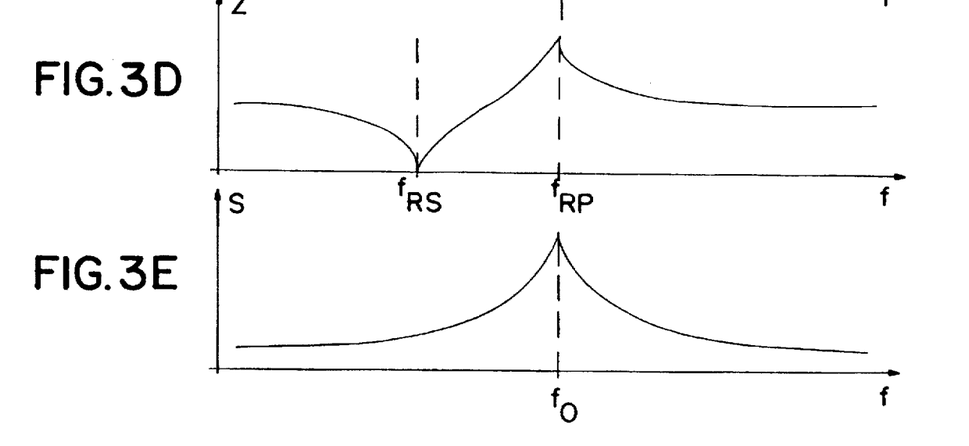

In all such applications, a problem is caused by the fact that ultrasonic piezoelectric transducers of the type shown in FIG. 1 possess a series resonance frequency and a parallel resonance frequency, these two resonance frequencies being different from each other. The diagram A of FIG. 3 shows the impedance versus frequency characteristic curve of an ultrasonic piezoelectric transducer of this type. The impedance Z has a minimum value at a frequency $f_{RS}$ which is the series resonance frequency, and a maximum value at a frequency $f_{RP}$ which is the parallel resonance frequency. The parallel resonance frequency $f_{RP}$ is about 16% higher than the series resonance frequency $f_{RS}$. The piezoelectric transducers show the maximum displacement at the series resonance frequency $f_{RS}$, as apparent from the diagram B in FIG. 3 which shows the characteristic curve of the ultrasound pressure P versus the frequency f; the ultrasound pressure P has a maximum value at the series resonance frequency $f_{RS}$ and a much lower value at the parallel resonance frequency $f_{RP}$. On the other hand, the piezoelectric transducers have the maximum receiving sensitivity at the parallel resonance frequency fRp as visible in the diagram C of FIG. 3 which shows the characteristic curve of the sensitivity S versus the frequency f; the sensitivity S has a maximum value at the parallel resonance frequency $f_{RP}$ and a much lower value at the series resonance frequency $f_{RS}$. Thus, for purposes of transmission the optimum conditions prevail when the operating frequency is equal to the series resonance frequency $f_{RS}$, and for purposes of reception the optimum conditions prevail when the operating frequency is equal to the parallel resonance frequency $f_{RP}$. In the applications mentioned above, however, the operating frequency is the same in the transmitting mode and in the receiving mode, viz the frequency of the electrical excitation signal applied to the transmission electrode in the transmitting mode. Thus, without special measures it is not possible to have the optimum operating frequency both for transmission and for reception.

In the circuit arrangement of FIG. 1, this problem is solved by the provision of an additional switch 24 which when closed establishes a short circuit connection between the annular electrode 14 and the common electrode 12. The switch 24 is open in the transmitting mode and closed in the receiving mode. Thus, in the transmitting mode the circuit arrangement has the configuration shown in FIG. 1 where the transmission electrode 14 is connected with the output of the excitation signal source 20 and not short-circuited to the common electrode 12, and where the reception electrode 13 is floating and isolated from the common electrode 12. With this configuration, the piezoelectric transducer shows the behaviour as explained above with the aid of the diagrams A, B and C of FIG. 3. The operating frequency $f_O$, i. e. the frequency of the excitation signal furnished by the excitation signal source 20, is selected to be equal to the series resonance frequency $f_{RS}$ which the piezoelectric transducer 10 has in this circuit configuration.

Figure 4:
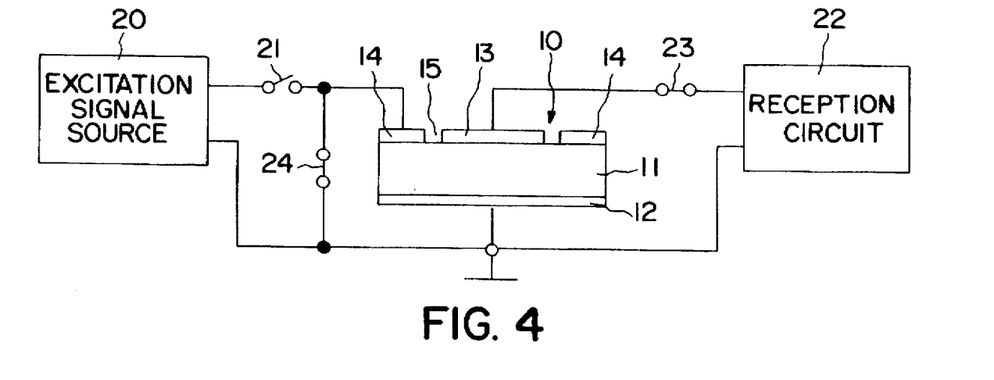
FIG. 4 is a diagram of the circuit arrangement of FIG. 1 in the receiving mode.

In the receiving mode, the circuit arrangement has the configuration shown in FIG. 4. The switch 21 is open so that the annular electrode 14 is disconnected from the excitation signal source 20, and the switch 23 is closed so that the central electrode 13 is connected with the input of the reception circuit 22. Moreover, the switch 24 is closed so that the annular electrode 14 is short-circuited to the common electrode 12. The short-circuiting of the annular electrode 14 has the effect that the series and parallel resonance frequencies of the piezoelectric transducer are shifted to lower values, as shown by the diagram D of FIG. 3. Diagram D shows the impedance versus frequency characteristic curve of the same piezoelectric transducer as in the case of diagram A, but with the annular electrode 14 being short-circuited to the common electrode 12. In diagram D, the parallel resonance frequency $f_{RP}$ has the same value as the series resonance frequency $f_{RS}$ had in diagram A without the short-circuit. This means that the same operating frequency $f_O$ is equal to the series resonance frequency $f_{RS}$ in the transmitting mode and equal to the parallel resonance frequency $f_{RP}$ in the receiving mode. Accordingly, the sensitivity S has the maximum value at the operating frequency $f_O$, as apparent from the diagram E of FIG. 3. In this way, optimum conditions are obtained both for transmission and for reception with a single piezoelectric transducer.

The switches 21, 23 and 24 are represented in FIGS. 1 and 4 by the symbols of mechanical switches in order to illustrate the function of these switches more clearly; in reality these switches, if they exist, will normally be fast electronic switches, such as field effect transistors.

It is, however, possible to omit the switches 21, 23 and 24 entirely. As a matter of fact, it is not necessary that there is a perfect short-circuit between the electrodes 14 and 12 in the receiving mode, and it is also not necessary that there is a perfect isolation between the electrodes 13 and 12 in the transmitting mode. It is sufficient if there is a low impedance connection between the electrode 14 and the common electrode 12 in the receiving mode, provided that the electrical impedance of this connection is less than the electrical impedance which exists between the transmission electrode 14 and the common electrode 12 at the series resonance frequency $f_{RS}$ of the ultrasonic piezoelectric transducer 10 in the transmitting mode. Likewise, it is sufficient if the electrical impedance between the reception electrode 13 and the common electrode 12 in the transmitting mode is higher than the electrical impedance which exists between the reception electrode 13 and the common electrode 12 at the parallel resonance frequency $f_{RP}$ of the piezoelectric transducer 10 in the receiving mode. Thus, in the circuit arrangement of FIGS. 1 and 4, the switches 21 and 24 can be omitted if the output impedance of the excitation signal source 20 is very small, in which case there will be a low impedance connection between the transmission electrode 14 and the common electrode 12 via the small output impedance of the excitation signal source 20 in the receiving mode; and the switch 23 can be omitted if the input impedance of the reception circuit 22 is high enough, in which case there will be a high impedance connection between the reception electrode 13 and the common electrode 12 via the large input impedance of the reception circuit 22 in the transmission mode.

Figure 5:
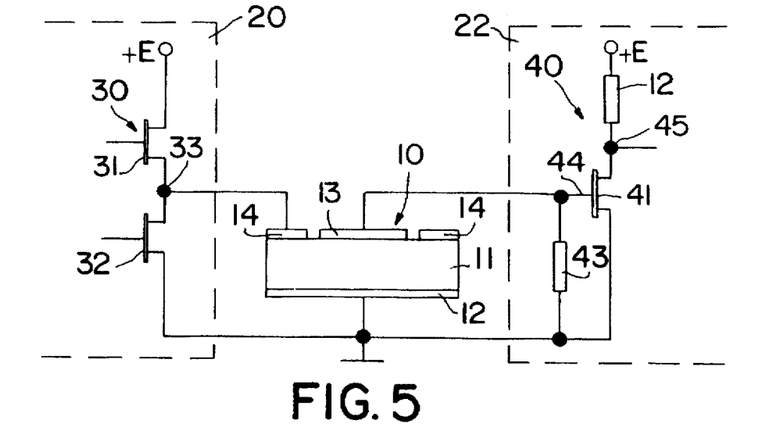
FIG. 5 is a diagram of a second embodiment of the circuit arrangement for performing the method according to the invention.

A circuit arrangement which meets the foregoing requirements and therefore does not require the use of switches performing the functions of the switches 21, 23 and 24 in FIGS. 1 and 4 is shown in FIG. 5. In FIG. 5, all parts and components that are identical with those of FIGS. 1 and 4 are designated with the same reference numerals. Thus, the circuit arrangement of FIG. 5 again comprises the ultrasonic piezoelectric transducer 10 having the piezoelectric body 11 and the electrodes 12, 13 and 14. FIG. 5 further shows a CMOS output circuit 30 of the excitation signal source 20, which CMOS output circuit comprises two CMOS field effect transistors 31, 32 connected in series via their sources and drains between a supply voltage +E and ground. The excitation signal is applied to the gates of the CMOS field effect transistors 31 and 32, and the electrode 14 is connected to the output terminal 33 of this circuit which is the source-drain connection between the two field effect transistors 31 and 32. The CMOS output circuit 30 has a very low output impedance which in the receiving mode essentially provides a short-circuit connection between the electrodes 14 and 12. Moreover, FIG. 5 shows an input amplifier stage 40 of the reception circuit 22, which input amplifier stage comprises a MOSFET 41 having a drain connected to the supply voltage +E via a resistor 42, a source connected to ground and a gate connected to ground via a high resistance gate resistor 43. The electrode 13 is permanently connected with the input terminal 44 of this input amplifier stage, which is the gate electrode of the MOSFET 41, while the output terminal 45 is the connection between the source and the resistor 42. This input amplifier stage 40 has a high input impedance which in the transmitting mode essentially isolates the electrode 13 from the common electrode 12. Thus, when the circuit arrangement of FIG. 5 operates in the transmitting mode, the piezoelectric transducer 10 has the impedance versus frequency characteristic curve shown in diagram A of FIG. 3, since the reception electrode 13 is essentially isolated from the common electrode 12 due to the high input impedance of the input amplifier stage 40; and when the circuit arrangement of FIG. 5 operates in the receiving mode, the piezoelectric transducer 10 has the impedance versus frequency characteristic curve shown in diagram D of FIG. 3, since the electrode 14 is essentially short-circuited to the common electrode 12 by the low output impedance of the CMOS output stage 30. Accordingly, the circuit arrangement of FIG. 5 provides the same optimum conditions both for transmission and for reception with a single piezoelectric transducer as the circuit arrangement of FIG. 1, but without any switches.

Figure 6:
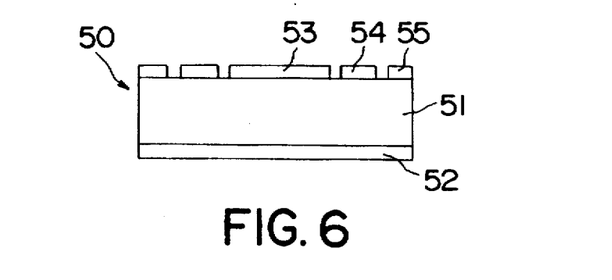
FIG. 6 shows another embodiment of the piezoelectric transducer which can be used in the circuit arrangement according to the invention.
Figure 7:
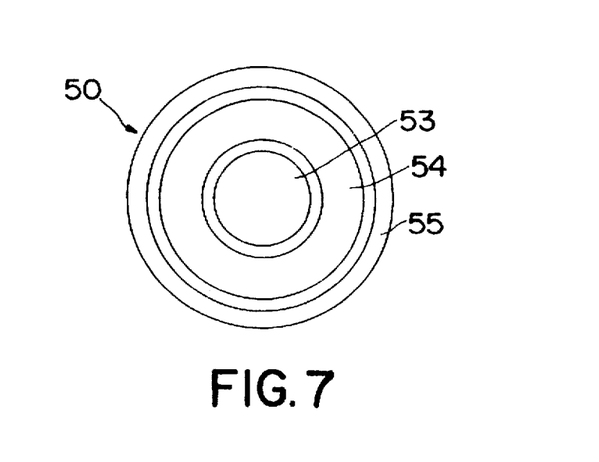
FIG. 7 is a top view of the of the piezoelectric transducer of FIG. 6.

The favorable results described before can be obtained with further modifications of the circuit arrangement. It is, of course, possible to exchange the roles of the electrodes 13 and 14 so that in the transmitting mode the central electrode 13 is used as the transmission electrode while the annular electrode 14 is essentially isolated from the common electrode 12, and in the receiving mode the annular electrode 14 is used as the reception electrode while the central electrode 13 is essentially short-circuited to the common electrode 12. Moreover, the ultrasonic piezoelectric transducer can be provided with more than three electrodes which can be electrically interconnected so that there are two or more common electrodes and/or two or more transmission electrodes and/or two or more reception elctrodes. As an example, FIG. 6 shows an ultrasonic piezoelectric transducer 50 having a body 51 of piezoelectric material in the form of a circular disk, an electrode 52 covering the bottom side of the body 51, and three electrodes 53, 54, 55 applied to the top side of the body 11. As visible in the top view of FIG. 7, the electrode 53 is a circular central electrode which is surrounded by the two annular electrodes 54 and 55. This transducer can be operated in any one of the following modifications:

1. Any two of the three top electrodes can be interconnected to form transmission electrodes while the third top electrode forms the reception electrode and the bottom electrode forms the common electrode.
2. Any two of the three top electrodes can be interconnected to form reception electrodes while the third top electrode forms the transmission electrode and the bottom electrode forms the common electrode.
3. The bottom electrode can be connected with any one of the three top electrodes to form common electrodes while the remaining two top electrodes form the transmission electrode and the reception electrode, respectively.
4. Any one of the three top electrodes can remain unconnected (floating) both in the transmitting mode and in the receiving mode while the remaining two top electrodes form the transmission electrode and the reception electrode, respectively, and the bottom electrode forms the common electrode.

Experimental tests have shown that in each of the foregoing cases the desired matching of the resonance frequencies as explained with the aid of FIG. 3 is obtained, provided that in each case a low impedance connection is established in the receiving mode between the transmission electrode (or electrodes) and the common electrode (or electrodes).

If for the sake of simplicity the one or more electrodes connected in a low impedance connection (or short-circuited) to the one or more common electrodes in the receiving mode are called the "commutated" electrodes, then in all of the foregoing embodiments the commutated electrodes are the transmission electrodes. This, however, is not imperative. It was found that the desired shifting of the resonant frequencies is always obtained if the capacitance measured between the one or more commutated electrodes and the one or more common electrodes in the transmitting mode is equal to the capacitance measured between the one or more transmission electrodes and the one or more common electrodes. This condition, of course, is automatically fulfilled if the commutated electrodes are at the same time the transmission electrodes, but it can also be fulfilled in other ways with a judicious design of the electrodes of the piezoelectric transducer. This will be explained with reference to FIGS. 8 to 10 of the drawings which illustrate a further embodiment of the circuit arrangement according to the invention.

Figure 8:
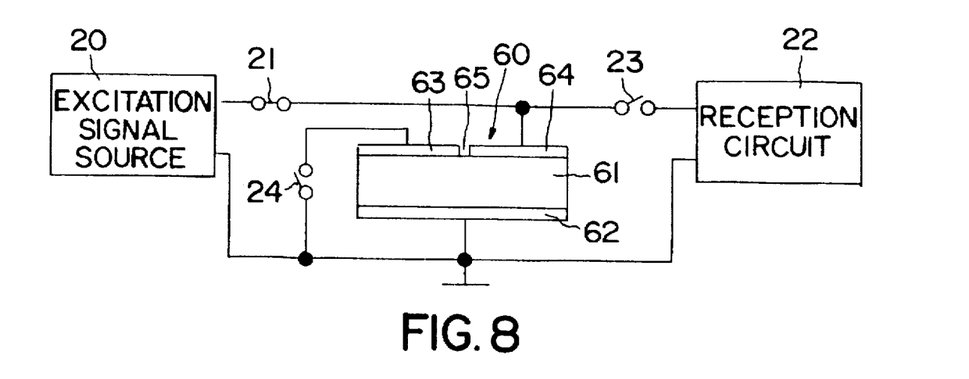
FIG. 8 is a diagram of a third embodiment of the circuit arrangement in the transmitting mode.
Figure 9:
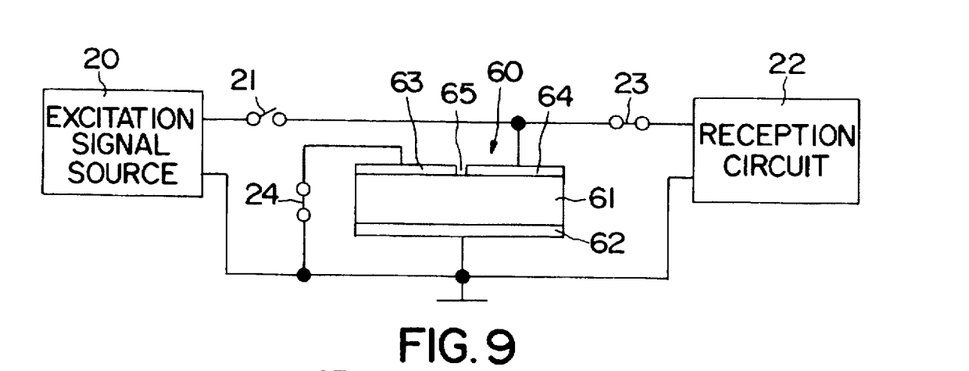
FIG. 9 is a diagram of the circuit arrangement of FIG. 8 in the receiving mode.
Figure 10:
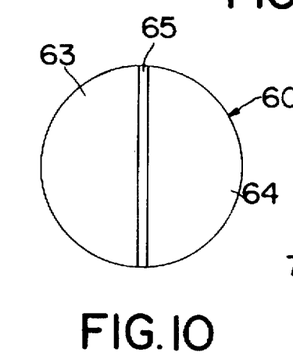
FIG. 10 is a top view of the piezoelectric transducer used in the circuit arrangement of FIGS. 8 and 9.

The circuit arrangement shown in FIGS. 8 and 9 is similar to the embodiment of FIG. 1 in that it comprises an excitation signal source 20, a reception circuit 22 and switches 21, 23 and 24 which have the same functions as the corresponding parts in FIG. 1 and therefore are designated with the same reference numerals. The circuit arrangement of FIGS. 8 and 9 further comprises an ultrasonic piezoelectric transducer 60 having a body 61 of piezoelectric material, a common electrode 62 applied to the bottom side of the body 61, and two electrodes 63 and 64 applied to the top side of the body 61. As visible in the top view of FIG. 10, the electrodes 63 and 64 have identical semicircular shapes and are separated and electrically isolated from each other by a diametrical gap 65. Thus, the transducer 60 of FIG. 8 differs from the transducer 10 of FIG. 1 only with respect to the shape of the top electrodes.

A further difference between the embodiments of FIGS. 1 and 8 resides in the manner in which the top electrodes are adapted to be connected with the excitation signal source 20 and the reception circuit 22, respectively. In FIG. 8, the same electrode 64 is adapted to be connected with the output of the excitation signal source 20 via the switch 21 and with the input of the reception circuit 22 via the switch 23, whereas the other electrode 63 is adapted to be short-circuited to the common electrode 62 via the switch 24.

FIG. 8 shows the configuration of the circuit arrangement in the transmitting mode, in which the switch 21 is closed and the switches 23 and 24 are open. Thus, the electrode 64 is connected with the output of the excitation signal source 20 so that it functions as transmission electrode, and at the same time it is disconnected from the input of the reception circuit 22. The other electrode 63 is floating and isolated from the common electrode 62.

FIG. 9 shows the configuration of the same circuit arrangement in the receiving mode, in which the positions of the switches are reversed so that the switch 21 is open and the switches 23 and 24 are closed. Thus, the electrode 64 is disconnected from the output of the excitation signal source 20 and connected with the input of the reception circuit 22 so that it functions as reception electrode. The other electrode 63 is now short-circuited to the common electrode 62 by the switch 24.

Although in this embodiment the transmission electrode 64 is used as the reception electrode in the receiving mode and therefore cannot be short-circuited to the common electrode, the desired matching of the resonance frequencies is again obtained because in the receiving mode a short-circuit is established between the electrode 63 and the common electrode 62. Due to the identical size and shape of the electrodes 63 and 64, the capacitance measured between the electrode 63 and the common electrode 62 when there is no short-circuit (i.e. in the transmitting mode) is equal to the capacitance measured between the transmission electrode 64 and the common electrode 62. Owing to this identical capacitance, the short-circuiting of the electrode 63 in the receiving mode has the same effect as if the transmission electrode 64 itself was short-circuited.

Figure 11:
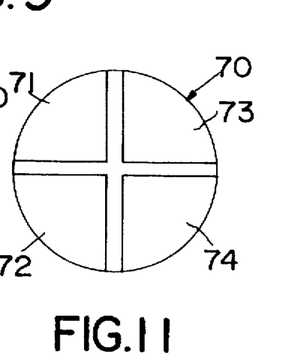
FIG. 11 is a top view of a further embodiment of the piezoelectric transducer which can be used in the circuit arrangement according to the invention.

The basic rule explained above with reference to FIGS. 8 to 10 can, of course, be extended to any number of transmission, reception and/or common electrodes. As an example, FIG. 11 shows the top view of a piezoelectric transducer 70 having four electrodes 71, 72, 73, 74 of quadrant-shape applied to its top side opposite to a common electrode (not shown) which is applied to its bottom side. Since all electrodes 71, 72, 73 and 74 are of the same size and shape, they have the same capacitance with respect to the common electrode. It would, therefore, be possible to use these electrodes in different combinations as transmission and/or reception electrodes and to replace one or more of the transmission electrodes by other electrodes in establishing the low impedance connections with the common electrode in the receiving mode.

In carrying out the invention it must always be observed that except for the commutated electrodes which are connected in a low impedance connection (or short-circuited) with the common electrode (or electrodes) in the receiving mode as explained above, there must not be any change in the connections between the common electrodes and other electrodes. In particular, neither the commutated electrodes, if they are different from the transmitting electrodes, nor the reveiving electrodes must be connected with the common electrodes in the transmitting mode. These electrodes must be essentially isolated from the common electrodes in the transmitting mode, or there must be at least a high impedance, as defined above, between these electrodes and the common electrodes in the transmitting mode.

The frequency matching obtained by the measures described above is not limited to transducers having circular disk-shaped bodies, but can be obtained with piezoelectric elements of any arbitrary configuration vibrating in a radial, thickness or overtones vibration mode.

We claim:

1. A method of operating an ultrasonic piezoelectric transducer alternatingly in a transmitting mode and in a receiving mode, the transducer comprising a single layer of piezoelectric material provided with at least three electrodes, wherein in the transmitting mode an electrical excitation signal is applied between at least one common electrode and at least one transmission electrode adapted to excite the body of piezoelectric material to mechanical vibrations in a radial, thickness or overtones vibration mode, and wherein in the receiving mode an electrical reception signal is collected between the at least one common electrode and at least one reception electrode adapted to convert mechanical vibrations of the single layer of piezoelectric material into an electrical signal, and wherein in the receiving mode at least one electrode which is not used as the at least one reception electrode is connected via a low impedance connection with the at least one common electrode.

2. The method as claimed in claim 1 wherein the at least one electrode which is connected via the low impedance connection with the at least one common electrode in the receiving mode is the at least one electrode which is used as the transmission electrode in the transmitting mode.

3. The method as claimed in claim 1 wherein the at least one electrode which is connected via the low impedance connection with the at least one common electrode in the receiving mode is different from the at least one electrode which is used as the transmission electrode in the transmitting mode.

4. The method as claimed in claim 3 wherein the at least one electrode which is connected via the low impedance connection with the at least one common electrode in the receiving mode essentially has the same electrical capacitance with respect to the at least one common electrode as the at least electrode used as the transmission electrode in the transmitting mode.

5. The method as claimed in claim 1 wherein the electrical impedance of the low impedance connection is less than the electrical impedance between the at least one transmission electrode and the at least one common electrode at the series resonance frequency of the ultrasonic piezoelectric transducer in the transmitting mode.

6. The method as claimed in claim 5 wherein the low impedance connection is essentially a short-circuit.

7. The method as claimed in claim 1 wherein in the transmitting mode the electrical impedance between the at least one common electrode and at least one electrode which is not used as transmission electrodes is higher than the electrical impedance between the at least one reception electrode and the at least one common electrode in the receiving mode.

8. A circuit arrangement comprising an ultrasonic piezoelectric transducer having a single layer of piezoelectric material provided with at least three electrodes, an excitation signal source adapted to be connected to at least one common electrode and at least one electrode which is used as a transmission electrode in a transmitting mode, a reception circuit adapted to be connected to the at least one common electrode and at least one electrode which is used as a reception electrode in a receiving mode, and means for establishing a low impedance connection in the receiving mode between the at least one common electrode and the at least one electrode which is not used as the reception electrode.

9. The circuit arrangement as claimed in claim 8 wherein the at least one electrode connected via the low impedance connection with the at least one common electrode in the receiving mode essentially have the same electrical capacitance with respect to the at least one common electrode as the at least one electrode used as the transmission electrode in the transmitting mode.

10. The circuit arrangement as claimed in claim 8 wherein the means for establishing the low impedance connection are switch means.

11. The circuit arrangement as claimed in claim 8 wherein the at least one electrode which is used as the transmission electrode in the transmitting mode is connected to the output of an excitation signal source having a low output impedance and is not used as a reception electrode in the receiving mode.

12. The circuit arrangement as claimed in claim 8 wherein the at least one electrode which is used as the reception electrode in the receiving mode is connected to the input of a reception circuit having a high input impedance and is not used as the transmission electrode in the transmitting mode.

13. A method of operating an ultrasonic piezoelectric transducer alternatingly in a transmitting mode and in a receiving mode, the transducer comprising a body of piezoelectric material provided with at least three electrodes, wherein in the transmitting mode an electrical excitation signal is applied between at least one common electrode and at least one transmission electrode adapted to excite the body of piezoelectric material to mechanical vibrations in a radial, thickness or overtones vibration mode, and wherein in the receiving mode an electrical reception signal is collected between the at least one common electrode and at least one reception electrode adapted to convert mechanical vibrations of the body of piezoelectric material into an electrical signal, and wherein in the receiving mode at least one electrode which is not used as the at least one reception electrode is connected via a low impedance connection with the at least one common electrode and is different from the at least one electrode which is used as the transmission electrode in the transmitting mode.

14. A method of operating an ultrasonic piezoelectric transducer alternatingly in a transmitting mode and in a receiving mode, the transducer comprising a body of piezoelectric material provided with at least three electrodes, wherein in the transmitting mode an electrical excitation signal is applied between at least one common electrode and at least one transmission electrode adapted to excite the body of piezoelectric material to mechanical vibrations in a radial, thickness or overtones vibration mode, and wherein in the receiving mode an electrical reception signal is collected between the at least one common electrode and at least one reception electrode adapted to convert mechanical vibrations of the body of piezoelectric material into an electrical signal, and wherein in the receiving mode at least one electrode which is not used as the at least one reception electrode is connected via a low impedance connection with the at least one common electrode, and wherein the low impedance connection has an electrical impedance which is less than the electrical impedance between the at least one transmission electrode and the at least one common electrode at the series resonance frequency of the ultrasonic piezoelectric transducer in the transmitting mode.

15. A method of operating an ultrasonic piezoelectric transducer alternatingly in a transmitting mode and in a receiving mode, the transducer comprising a body of piezoelectric material provided with at least three electrodes, wherein in the transmitting mode an electrical excitation signal is applied between at least one common electrode and at least one transmission electrode adapted to excite the body of piezoelectric material to mechanical vibrations in a radial, thickness or overtones vibration mode, and wherein in the receiving mode an electrical reception signal is collected between the at least one common electrode and at least one reception electrode adapted to convert mechanical vibrations of the body of piezoelectric material into an electrical signal, and wherein in the receiving mode at least one electrode which is not used as the at least one reception electrode is connected via a low impedance connection with the at least one common electrode and wherein in the transmitting mode the electrical impedance between the at least one common electrode and at least one electrode which is not used as a transmission electrode is higher than the electrical impedance between the at least one reception electrode and the at least one common electrode in the receiving mode.

16. A circuit arrangement comprising an ultrasonic piezoelectric transducer having a body of piezoelectric material provided with at least three electrodes, an excitation signal source adapted to be connected to at least one common electrode and at least one electrode which is used as a transmission electrode in a transmitting mode, a reception circuit adapted to be connected to the at least one common electrode and the at least one electrode which is used as a reception electrode in a receiving mode, means for establishing a low impedance connection in the receiving mode between the at least one common electrode and the at least one electrode which is not used as the reception electrode and wherein the at least one electrode connected to the low impedance connection with the at least one common electrode in the receiving mode essentially has the same electrical capacitance with respect to the at least one common electrode as the at least one electrode used as the transmission electrode in the transmitting mode.

* * * * *